(12) United States Patent
Baek et al.

(10) Patent No.: US 8,890,142 B2
(45) Date of Patent: Nov. 18, 2014

(54) OXIDE ELECTRONIC DEVICE AND METHOD FOR MANUFACTURING THE SAME

(71) Applicant: Korea Institute of Science and Technology, Seoul (KR)

(72) Inventors: Seung Hyub Baek, Seoul (KR); Shin Ik Kim, Seoul (KR); Jin Sang Kim, Seoul (KR); Ji Won Choi, Seoul (KR); Seok Jin Yoon, Seoul (KR); Chong Yun Kang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 13/774,722

(22) Filed: Feb. 22, 2013

(65) Prior Publication Data

US 2014/0048796 A1    Feb. 20, 2014

(30) Foreign Application Priority Data

Aug. 17, 2012   (KR) .......................... 10-2012-0090297

(51) Int. Cl.
     *H01L 29/12*       (2006.01)
     *H01L 29/66*       (2006.01)
     *H01L 29/778*      (2006.01)

(52) U.S. Cl.
     CPC ........ *H01L 29/778* (2013.01); *H01L 29/66969* (2013.01)
     USPC ...................... 257/43; 257/E29.086; 365/109

(58) Field of Classification Search
     USPC .................. 257/43, E29.086; 438/3; 365/109
     See application file for complete search history.

(56) References Cited

U.S. PATENT DOCUMENTS

| 2009/0097299 A1* | 4/2009 | Tanaka et al. ................. 365/145 |
| 2012/0025160 A1* | 2/2012 | Sonehara ............................ 257/2 |
| 2012/0276659 A1* | 11/2012 | Wang et al. ........................ 438/3 |
| 2013/0208551 A1* | 8/2013 | Zhu et al. ................ 365/189.011 |

FOREIGN PATENT DOCUMENTS

| JP | 2006-156816 A | 6/2006 |
| JP | 2008-306178 A | 12/2008 |
| JP | 2009-283960 A | 12/2009 |
| KR | 100413523 B1 | 1/2004 |
| KR | 100770132 B1 | 10/2007 |
| KR | 100857683 B1 | 9/2008 |

* cited by examiner

*Primary Examiner* — Phuc Dang
(74) *Attorney, Agent, or Firm* — Ladas & Parry LLP

(57) ABSTRACT

Provided is an oxide electronic device, including: an oxide substrate; an oxide thin film layer formed on the oxide substrate and containing an oxide that is heterogeneous with respect to the oxide substrate; and a ferroelectric layer formed on the oxide thin film layer and controlling electric conductivity of two-dimensional electron gas (2DEG) generated at an interface between the oxide substrate and the oxide thin film layer. Provided also is a method for manufacturing an oxide electronic device, including: depositing, on an oxide substrate, an oxide that is heterogeneous with respect to the oxide substrate to form an oxide thin film layer; and forming a ferroelectric layer on the oxide thin film layer, wherein the ferroelectric layer controls electric conductivity of 2DEG generated at an interface between the oxide substrate and the oxide thin film layer.

20 Claims, 2 Drawing Sheets

OXIDE ELECTRONIC DEVICE AND METHOD FOR MANUFACTURING THE SAME

CROSS-REFERENCE TO RELATED APPLICATION

This application claims priority to Korean Patent Application No. 10-2012-0090297, filed on Aug. 17, 2012, and all the benefits accruing therefrom under 35 U.S.C. §119, the contents of which in its entirety are herein incorporated by reference.

BACKGROUND

1. Field

The present disclosure relates to an oxide electronic device and a method for manufacturing the same. More particularly, the present disclosure relates to an oxide electronic device, which allows electric conductivity of two-dimensional electron gas (2DEG) generated at an interface of heterogeneous oxides to be controlled stably in a non-volatile mode, as well as to a method for manufacturing the same.

2. Description of the Related Art

Electronic devices, such as transistors, which repeat logging and deletion of data, have high convenience. Due to this, electronic devices, such as transistors, are used widely in portable memory media, including a USB memory and memory card, or a radio-frequency (RF) tag as a medium for radio-frequency identification (RFID) performing wireless reading of information.

In general, silicon (Si) materials are used in most electronic devices. However, it is expected that silicon materials reach the limit in downsizing and functional upgrading within the next 10 years. Therefore, in order to overcome the limit of conventional Si materials, active studies have been conducted to develop novel materials substituting for Si. As typical examples, there are nitride materials, such as GaN-based materials, and oxide materials based on a metal-oxide structure.

In addition, many attempts have been made to realize electronic devices, such as transistors, by using two-dimensional electron gas (2DEG). This is because 2DEG has not only high charge mobility but also specific quantum dynamic characteristics unique to 2DEG. Due to such characteristics, it is possible to overcome the limit of a silicon (Si) material in downsizing and functional upgrading. Particularly, 2DEG is generated at the fusion interface of heterogeneous materials different from each other. For example, Korean Patent Publication Nos. 10-0413523, 10-0770132 and 10-0857683 disclose nitride devices based on a nitride material and using 2DEG generated at an interface between a GaN layer and AlGaN layer.

Recently, oxide materials have been spotlighted more. Oxide materials have higher conductivity as compared to Si materials or nitride materials, show various properties, including dielectric properties and magnetic properties, and facilitate fusion of heterogeneous materials due to a similar crystal structure. Therefore, it is possible to realize multifunctional devices having novel characteristics when using oxide materials. Herein, controlling electric conductivity of 2DEG by using external electric stimulation is a highly important technology in realizing oxide-based electronic devices, and also affects the characteristics of electronic devices.

According to the related art, charge injection through a metal gate electrode or conductive probe tip has been used to control electric conductivity of 2DEG of oxide devices. However, in this case, the electric conductivity of 2DEG controlled by such charge injection tends to have volatility with time, and thus is not maintained stably but experiences a change. In this context, there is a problem in that continuous application of electric energy is required to prevent such volatility. As a result, the resultant device requires a large amount of driving energy.

REFERENCES OF THE RELATED ART

Patent Document (Patent Document 1) Korean Patent Publication No. 10-0413523
(Patent Document 2) Korean Patent Publication No. 10-0770132
(Patent Document 3) Korean Patent Publication No. 10-0857683

SUMMARY

The present disclosure is directed to providing an oxide electronic device, which allows electric conductivity of two-dimensional electron gas (2DEG) generated at an interface of heterogeneous oxides to be controlled stably in a non-volatile mode, as well as a method for manufacturing the same.

In one aspect, there is provided an oxide electronic device, including:

an oxide substrate;

an oxide thin film layer formed on the oxide substrate and containing an oxide that is heterogeneous with respect to the oxide substrate; and a ferroelectric layer formed on the oxide thin film layer and controlling electric conductivity of two-dimensional electron gas (2DEG) generated at an interface between the oxide substrate and the oxide thin film layer.

The oxide substrate and the oxide thin film layer may have an oxide with an $ABO_3$ structure. In addition, the ferroelectric layer may include a ferroelectric material with an $ABO_3$ structure.

In another aspect, there is provided a method for manufacturing an oxide electronic device, including:

depositing, on an oxide substrate, an oxide that is heterogeneous with respect to the oxide substrate to form an oxide thin film layer; and forming a ferroelectric layer on the oxide thin film layer, wherein the ferroelectric layer controls electric conductivity of two-dimensional electron gas (2DEG) generated at an interface between the oxide substrate and the oxide thin film layer.

According to the present disclosure, electric conductivity of 2DEG generated at an interface of heterogeneous oxides is controlled stably in a non-volatile mode by spontaneous polarization of a ferroelectric material. As a result, electric conductivity of 2DEG is maintained continuously without external electric energy, thereby reducing consumption of the driving energy of a device.

BRIEF DESCRIPTION OF THE DRAWINGS

The above and other aspects, features and advantages of the disclosed exemplary embodiments will be more apparent from the following detailed description taken in conjunction with the accompanying drawings in which.

DETAILED DESCRIPTION OF MAIN ELEMENTS

Figure 1A:
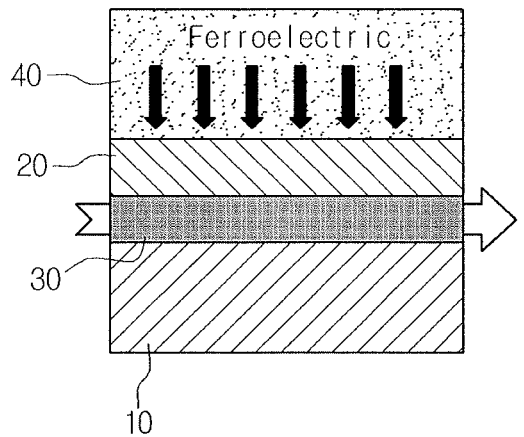
FIGS. 1a and 1b are schematic sectional views of the oxide electronic device according to an embodiment, illustrating the principle of controlling electric conductivity of two-dimensional electron gas (2DEG)

10: oxide substrate
20: oxide thin film
30: 2DEG conductive layer
40: ferroelectric layer
50: source electrode
60: drain electrode
70: connection electrode (metal gate electrode)
80: connection electrode (conductive probe tip)

DETAILED DESCRIPTION

Exemplary embodiments now will be described more fully hereinafter with reference to the accompanying drawings, in which exemplary embodiments are shown.

Figure 1B:
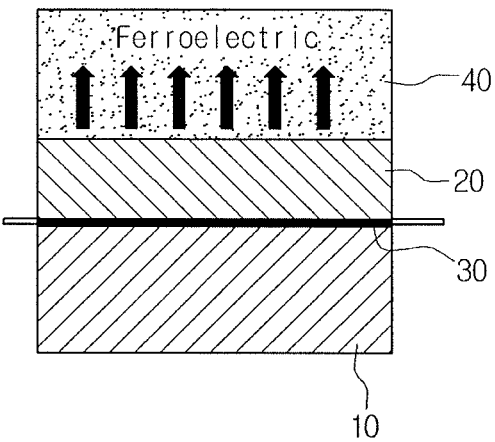
Figure 2:
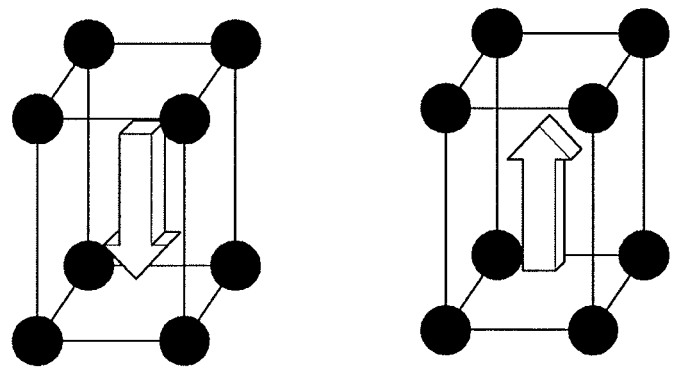
FIG. 2 is a molecular schematic view showing spontaneous polarization switching that occurs in a ferroelectric material.
Figure 3A:
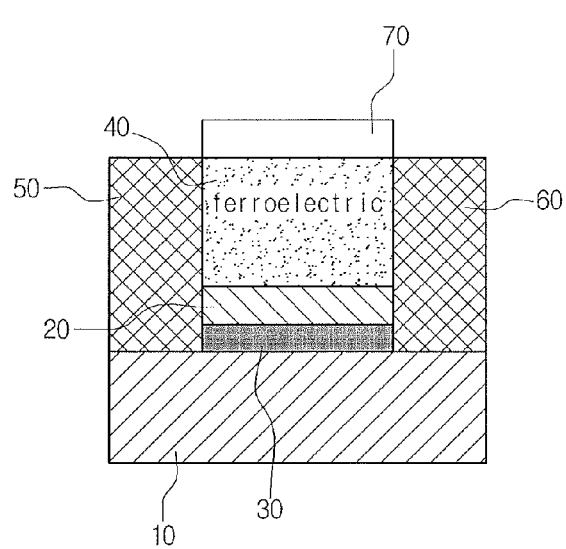
FIGS. 3a and 3b are schematic sectional views of the oxide electronic device, particularly a transistor, according to an embodiment.
Figure 3B:
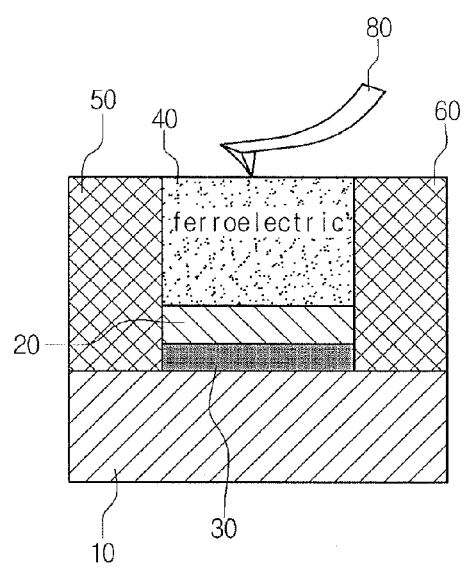

FIGS. 1a and 1b are schematic sectional views of the oxide electronic device according to an embodiment, illustrating the principle of controlling electric conductivity of two-dimensional electron gas (2DEG). FIG. 2 is a molecular schematic view showing spontaneous polarization switching that occurs in a ferroelectric material. In addition, FIGS. 3a and 3b are schematic sectional views of the oxide electronic device, particularly a transistor, according to an embodiment.

Referring to FIGS. 1a and 1b, the oxide electronic device according to an embodiment includes an oxide substrate 10, an oxide thin film layer 20 formed on the oxide substrate 10, and a ferroelectric layer 40 formed on the oxide thin film layer 20. Herein, the oxide thin film layer 20 includes an oxide that is heterogeneous with respect to the oxide substrate 10. In addition, two-dimensional electron gas (2DEG) is generated at the fusion interface of such heterogeneous oxide substrate 10 and oxide thin film layer 20. In FIGS. 1a and b, reference numeral 30 represents a conductive layer formed by 2DEG. As used herein, the term 'oxide' means a metal oxide containing at least one metal in its molecule.

The oxide substrate 10 may be any substrate having strength as a support and capable of generating 2DEG at the interface with the oxide thin film layer 20. There is no particular limitation in oxides forming the oxide substrate 10. Particularly, the oxide substrate 10 may include an oxide having an $ABO_3$ structure. As used herein, $ABO_3$ has the meaning as defined below:

$ABO_3$, wherein A and B are metals different from each other, and each of A and B may include one or more metals. For example, A may be at least one selected from the group consisting of Sr, La, Ba, Al, Pb, Nd, Dy, Gd, Ca, Bi, Ag, K and Na, while B may be at least one selected from the group consisting of Ti, Al, Zr, Nb, Sc, Ga, Ba, Ta and Fe.

The oxide substrate 10 may include an oxide having an $ABO_3$ structure, and for example, may be selected from $SrTiO_3$, $NdGaO_3$, $DyScO_3$, $GdScO_3$ and $LaAlO_3$. In addition, the oxide substrate may be based on an oxide having an $ABO_3$ structure and may be terminated with another oxide, such as $TiO_2$ and SrO. More particularly, as the oxide substrate 10, a $TiO_2$-terminated $SrTiO_3$ substrate may be used.

In addition, the oxide thin film layer 20 includes any oxide that is heterogeneous with respect to the oxide forming the oxide substrate 10 so as to generate 2DEG at the fusion interface with the oxide substrate 10. Particularly, the oxide thin film layer 20 may include the above-mentioned oxide having an $ABO_3$ structure. The oxide thin film layer 20 may include an oxide having an $ABO_3$ structure, and for example, may be selected from $LaAlO_3$, $BiFeO_3$, $AgTaO_3$, $KNbO_3$ and $BaTiO_3$.

The ferroelectric layer 40 may include a ferroelectric material to generate polarization. Particularly, the ferroelectric material may have a Perovskite structure and may be selected from the above-mentioned oxides having an $ABO_3$ structure. Ferroelectric materials selected from oxides having an $ABO_3$ structure are advantageous to generate spontaneous polarization, and thus are useful in the device as disclosed herein. According to some embodiments, the ferroelectric material may be selected from materials having a PZT- or BST-based composition. More particularly, the ferroelectric material may be selected from PZT-based oxides having an $ABO_3$ structure as represented by the following Chemical Formula 1, and BST-based oxides having an $ABO_3$ structure as represented by the following Chemical Formula 2:

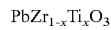  [Chemical Formula 1]

$PbZr_{1-x}Ti_xO_3$

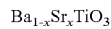  [Chemical Formula 2]

$Ba_{1-x}Sr_xTiO_3$

In the above Chemical Formulae 1 and 2, atomic fraction x satisfies the condition of $0 \leq x \leq 1$, particularly $0.1 \leq x \leq 0.9$.

According to an embodiment, the ferroelectric layer 40 including the above-mentioned ferroelectric material allows electric conductivity of 2DEG generated at the interface between the oxide substrate 10 and the oxide thin film layer 20 to be controlled stably in a non-volatile mode. Particularly, once the electric conductivity of 2DEG is controlled, it is maintained stably without volatility even after a lapse of time due to the spontaneous polarization generated at the ferroelectric material. As shown in FIG. 1a, 1b and FIG. 2, the electric conductivity of 2DEG, i.e., carrier concentration of 2DEG is controlled in the direction (shown by the arrow mark in figures) of polarization of the ferroelectric material. As a result, the electric conductivity of 2DEG is maintained continuously in a non-volatile mode even without external electric energy, thereby reducing consumption of the driving energy of a device.

In addition, in the oxide electronic device disclosed herein, the oxide substrate 10, the oxide thin film layer 20 and the ferroelectric layer 40 are based on oxides, particularly those having an $ABO_3$ structure. As a result, the oxide electronic device disclosed herein has higher superconductive property than the conventional silicon (Si)- or nitride-based devices, as well as ferroelectric and ferromagnetic properties.

As mentioned earlier, the oxide electronic device includes a basic stacked structure including the oxide substrate 10, the oxide thin film layer 20 and the ferroelectric layer 40, and may further include other conventional components. Particularly, to realize a transistor device, a source electrode 50 and a drain electrode 60 may be further incorporated. Herein, the source electrode 50 and the drain electrode 60 may be formed at a site from which the oxide thin film layer 20 and the ferroelectric layer 40 are etched partially, to provide a downsized and slim device. Particularly, as shown in FIG. 3, the oxide thin film layer 20 and ferroelectric layer 40 may be etched partially (at the right side and the left side in the figure), and the source electrode 50 and the drain electrode 60 may be formed at the etched site.

Further, connection electrodes 70 and 80 are formed on the ferroelectric layer 40. The connection electrodes 70 and 80 are for applying voltage to the ferroelectric layer 40, and may be selected from a metal gate electrode 70 as shown in portion (a) of FIG. 3 and a conductive probe tip 80 as shown in portion (b) of FIG. 3. Herein, the polarization of the ferroelectric layer 40 may be controlled by the voltage applied through the connection electrodes 70 and 80.

The oxide electronic device as described above may be obtained by various processes. More particularly, the oxide electronic device may be obtained by the method described hereinafter. The method will now be described in detail.

The method for manufacturing an oxide electronic device according to an embodiment of the present disclosure includes: depositing, on an oxide substrate 10, an oxide that is heterogeneous with respect to the oxide substrate 10 to form an oxide thin film layer 20; and forming a ferroelectric layer 40 on the oxide thin film layer 20, wherein the ferroelectric layer controls electric conductivity of two-dimensional electron gas (2DEG) generated at an interface between the oxide substrate 10 and the oxide thin film layer 20.

In addition, when manufacturing a transistor as shown in FIGS. 3a and 3b, the method further includes: carrying out partial etching of the oxide thin film layer 20 and the ferroelectric layer 40; forming a source electrode 50 and a drain electrode 60 at the etched site; and forming connection electrodes 70 and 80 on the ferroelectric layer 40.

Particular examples of the materials forming the oxide substrate 10, the oxide thin film layer 20 and the ferroelectric layer 40 are the same as described above. The materials may be selected from the above-mentioned oxides having an $ABO_3$ structure.

The oxide thin film layer 20 may be grown on the oxide substrate 10 by a deposition process, and the deposition process is not particularly limited. For example, one or more processes selected from pulsed laser deposition (PLD), sputtering, epitaxy deposition, physical vapor deposition (PVD), chemical vapor deposition (CVD), electron beam evaporation, and atomic layer deposition (ALD) may be used.

Particularly, the oxide thin film layer 20 may be formed by PLD, sputtering or epitaxy deposition processes. Such processes may reduce a change in characteristics caused by introduction of impurities or defects, and are favorable to formation of uniform thin films. More particularly, the oxide thin film layer 20 may be formed (grown) by using a PLD system equipped with a reflection high energy electron diffraction (RHEED) unit to control the thickness of the oxide thin film layer 20 to a unit cell scale. In addition, the oxide thin film layer 20 may be grown on the oxide substrate 10 to a thickness larger than the critical thickness (3 unit cells). For example, the oxide thin film layer 20 may have a thickness of 2 nm-100 nm.

Further, after forming the oxide thin film layer 20 as described above, the ferroelectric layer 40 is formed on the oxide thin film layer 20 by depositing a ferroelectric material thereon in the form of a thin film through an in-situ process. Particular examples of the deposition process are the same as described above. More particularly, PLD, sputtering or epitaxy deposition processes may be used. For example, the ferroelectric layer 40 may have a thickness of 10 nm-1 μm (micrometer).

In addition, the oxide thin film layer 20 and the ferroelectric layer 40 are etched so as to provide the structure as shown in FIGS. 3a and 3b. There is no particular limitation in the etching process, as long as the etching process accomplishes partial etching of the oxide thin film layer 20 and the ferroelectric layer 40 so that a source electrode 50 and a drain electrode 60 may be in contact with the substrate 10. For example, the etching process may be selected from dry processes and wet processes. According to an embodiment, the etching process may include a photolithography process. After the etching, the source electrode 50 and the drain electrode 60 are formed. Then, a conductive metal is deposited on the ferroelectric layer 40 to form a metal gate electrode 70 or to make a contact with a conductive probe tip 80.

As can be seen from the foregoing, electric conductivity of 2DEG undergoes no volatility with time due to the spontaneous polarization of the ferroelectric layer 40, and thus is maintained stably. As a result, electric conductivity of 2DEG is maintained continuously in a non-volatile mode without any external electric energy, thereby reducing consumption of the driving energy of a device.

While the exemplary embodiments have been shown and described, it will be understood by those skilled in the art that various changes in form and details may be made thereto without departing from the spirit and scope of the present disclosure as defined by the appended claims.

What is claimed is:

1. An oxide electronic device, comprising:
an oxide substrate;
an oxide thin film layer formed on the oxide substrate and containing an oxide that is heterogeneous with respect to the oxide substrate; and
a ferroelectric layer formed on the oxide thin film layer and controlling electric conductivity of two-dimensional electron gas (2DEG) generated at an interface between the oxide substrate and the oxide thin film layer, wherein the oxide thin film layer and the ferroelectric layer are partially etched.

2. The oxide electronic device according to claim 1, further comprising:
a source electrode and a drain electrode formed at the partially etched site of the oxide thin film layer, and
a connection electrode formed on the ferroelectric layer.

3. The oxide electronic device according to claim 1, wherein the oxide substrate and the oxide thin film layer comprise an oxide having an $ABO_3$ structure.

4. The oxide electronic device according to claim 2, wherein the oxide substrate and the oxide thin film layer comprise an oxide having an $ABO_3$ structure.

5. The oxide electronic device according to claim 1, wherein the ferroelectric layer comprises a ferroelectric material having an $ABO_3$ structure.

6. The oxide electronic device according to claim 2, wherein the ferroelectric layer comprises a ferroelectric material having an $ABO_3$ structure.

7. The oxide electronic device according to claim 3, wherein the oxide substrate is a $SrTiO_3$ substrate, or a $SrTiO_3$ substrate whose surface is terminated with $TiO_2$.

8. The oxide electronic device according to claim 4, wherein the oxide substrate is a $SrTiO_3$ substrate, or a $SrTiO_3$ substrate whose surface is terminated with $TiO_2$.

9. The oxide electronic device according to claim 3, wherein the oxide thin film layer comprises $LaAlO_3$.

10. The oxide electronic device according to claim 4, wherein the oxide thin film layer comprises $LaAlO_3$.

11. The oxide electronic device according to claim 5, wherein the ferroelectric layer comprises a PZT- or BST-based oxide.

12. The oxide electronic device according to claim 6, wherein the ferroelectric layer comprises a PZT- or BST-based oxide.

13. The oxide electronic device according to claim 4, wherein
the A of the $ABO_3$ structure of either the oxide substrate or the oxide thin film layer is selected from the group consisting of Sr, La, Ba, Al, Pb, Nd, Dy, Gd, Ca, Bi, Ag, K and Na; and
the B of the $ABO_3$ structure of either the oxide substrate or the oxide thin film layer is selected from the group consisting of Ti, Al, Zr, Nb, Sc, Ga, Ba, Ta and Fe.

14. The oxide electronic device according to claim 1, wherein
the oxide substrate is selected from the group consisting of $SrTiO_3$, $NdGaO_3$, $DyScO_3$, $GdScO_3$, $LaAlO_3$, and $TiO_2$-terminated $SrTiO_3$;
the oxide thin film layer is selected from the group consisting of $LaAlO_3$, $BiFeO_3$, $AgTaO_3$, $KNbO_3$ and $BaTiO_3$; and
the ferroelectric layer comprises a PZT-based oxide composition or a BST-based oxide composition in which the PZT-based oxide composition comprises $PbZr_{1-x}Ti_xO_3$ and the BST-based oxide composition comprises $Ba_{1-x}Sr_xTiO_3$ wherein $0 \leq x \leq 1$.

15. A method for manufacturing an oxide electronic device, comprising:
depositing, on an oxide substrate, an oxide that is heterogeneous with respect to the oxide substrate to form an oxide thin film layer;
forming a ferroelectric layer on the oxide thin film layer, wherein the ferroelectric layer controls electric conductivity of two-dimensional electron gas (2DEG) generated at an interface between the oxide substrate and the oxide thin film layer; and
partially etching the oxide thin film layer and the ferroelectric layer.

16. The method for manufacturing an oxide electronic device according to claim 15, which further comprises:
forming a source electrode and a drain electrode at the partially etched site of the oxide thin film layer; and
forming a connection electrode on the ferroelectric layer.

17. The method for manufacturing an oxide electronic device according to claim 15, wherein the oxide thin film layer and the ferroelectric layer are formed by a pulsed laser deposition (PLD), sputtering or epitaxy deposition process.

18. The method for manufacturing an oxide electronic device according to claim 16, wherein the oxide thin film layer and the ferroelectric layer are formed by a pulsed laser deposition (PLD), sputtering or epitaxy deposition process.

19. An oxide electronic device, comprising:
an oxide substrate;
an oxide thin film layer on the oxide substrate wherein the oxide thin film layer containing an oxide that is heterogeneous with respect to the oxide substrate;
a ferroelectric layer on the oxide thin film layer and the oxide thin film layer, wherein the oxide thin film layer and the ferroelectric layer are partially etched;
a source electrode and a drain electrode at the partially etched site of the oxide thin film layer, and
a connection electrode on the ferroelectric layer.

20. The oxide electronic device according to claim 19, wherein the ferroelectric layer controlling electric conductivity of a two-dimensional electron gas (2DEG) generated at an interface between the oxide substrate and the oxide thin film layer.

* * * * *